United States Patent
Lin et al.

(10) Patent No.: US 11,984,316 B2
(45) Date of Patent: May 14, 2024

(54) POROGEN BONDED GAP FILLING MATERIAL IN SEMICONDUCTOR MANUFACTURING

(71) Applicant: Taiwan Semiconductor Manufacturing Company, Ltd., Hsin-Chu (TW)

(72) Inventors: Bo-Jiun Lin, Hsinchu County (TW); Ching-Yu Chang, Hsin-Chu (TW); Hai-Ching Chen, Hsinchu (TW); Tien-I Bao, Taoyuan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/321,077

(22) Filed: May 22, 2023

(65) Prior Publication Data
US 2023/0299003 A1    Sep. 21, 2023

Related U.S. Application Data

(60) Continuation of application No. 17/120,672, filed on Dec. 14, 2020, now Pat. No. 11,658,120, which is a
(Continued)

(51) Int. Cl.
*H01L 21/02* (2006.01)
*H01L 21/768* (2006.01)
(Continued)

(52) U.S. Cl.
CPC .. *H01L 21/02203* (2013.01); *H01L 21/02126* (2013.01); *H01L 21/02216* (2013.01);
(Continued)

(58) Field of Classification Search
CPC ............. H01L 29/66795; H01L 29/785; H01L 21/823431; H01L 29/66545;
(Continued)

(56) References Cited

U.S. PATENT DOCUMENTS

| | | |
|---|---|---|
| 5,270,259 A | 12/1993 | Ito et al. |
| 5,972,803 A | 10/1999 | Shu et al. |

(Continued)

FOREIGN PATENT DOCUMENTS

| | | |
|---|---|---|
| JP | 2013012653 | 1/2013 |
| KR | 20060064289 | 6/2006 |

(Continued)

OTHER PUBLICATIONS

Translated Office Action dated Sep. 8, 2016, Application No. KR10-2015-0159747, 13 pages.
(Continued)

*Primary Examiner* — Shouxiang Hu
(74) *Attorney, Agent, or Firm* — Haynes and Boone, LLP

(57) ABSTRACT

A device includes a substrate; a first layer over the substrate, the first layer containing a plurality of fin features and a trench between two adjacent fin features. The device also includes a porous material layer having a first portion and a second portion. The first portion is disposed in the trench. The second portion is disposed on a top surface of the first layer. The first and the second portions contain substantially same percentage of Si, substantially same percentage of O, and substantially same percentage of C.

20 Claims, 6 Drawing Sheets

Related U.S. Application Data division of application No. 15/942,947, filed on Apr. 2, 2018, now Pat. No. 10,867,922, which is a division of application No. 14/752,097, filed on Jun. 26, 2015, now Pat. No. 9,941,157.

(51) Int. Cl.
*H01L 23/31* (2006.01)
*H01L 23/485* (2006.01)
*H01L 23/522* (2006.01)
*H01L 23/528* (2006.01)
*H01L 23/532* (2006.01)
*H01L 23/58* (2006.01)
*H01L 29/06* (2006.01)

(52) U.S. Cl.
CPC .... *H01L 21/02282* (2013.01); *H01L 21/7682* (2013.01); *H01L 21/76837* (2013.01); *H01L 23/3178* (2013.01); *H01L 23/3185* (2013.01); *H01L 23/485* (2013.01); *H01L 23/522* (2013.01); *H01L 23/528* (2013.01); *H01L 23/5329* (2013.01); *H01L 23/53295* (2013.01); *H01L 23/585* (2013.01); *H01L 29/0642* (2013.01); *H01L 29/0649* (2013.01); *H01L 2221/1047* (2013.01)

(58) Field of Classification Search
CPC ............. H01L 27/0886; H01L 29/0649; H01L 21/823481; H01L 27/0924; H01L 23/5329; H01L 21/02126; H01L 21/02203; H01L 21/02216; H01L 21/02282; H01L 21/7682; H01L 21/76837; H01L 23/3178; H01L 23/3185; H01L 23/485; H01L 23/522; H01L 23/528; H01L 23/53295; H01L 23/585; H01L 29/0642; H01L 2221/1047; H01L 21/76831; H01L 27/12
See application file for complete search history.

(56) References Cited

U.S. PATENT DOCUMENTS

| | | | |
|---|---|---|---|
| 6,846,515 | B2 | 1/2005 | Vrtis et al. |
| 7,820,513 | B2 | 10/2010 | Hareland et al. |
| 8,889,544 | B2 | 11/2014 | Wu et al. |
| 9,941,157 | B2 | 4/2018 | Lin et al. |
| 2006/0069171 | A1 | 3/2006 | Prokopowicz et al. |
| 2006/0105567 | A1 | 5/2006 | Ramachandrarao et al. |
| 2007/0001219 | A1 | 6/2007 | Radosavljevic et al. |
| 2010/0123224 | A1 | 5/2010 | Lin et al. |
| 2015/0200133 | A1 | 7/2015 | Chou et al. |
| 2016/0379874 | A1 | 12/2016 | Lin et al. |
| 2018/0226293 | A1 | 8/2018 | Lin et al. |

FOREIGN PATENT DOCUMENTS

| | | |
|---|---|---|
| KR | 20070103318 | 10/2007 |
| KR | 20130016007 | 2/2013 |

OTHER PUBLICATIONS

Translated Notice of Allowance dated Dec. 7, 2016, Application No. KR10-2015-0159747, 3 pages.

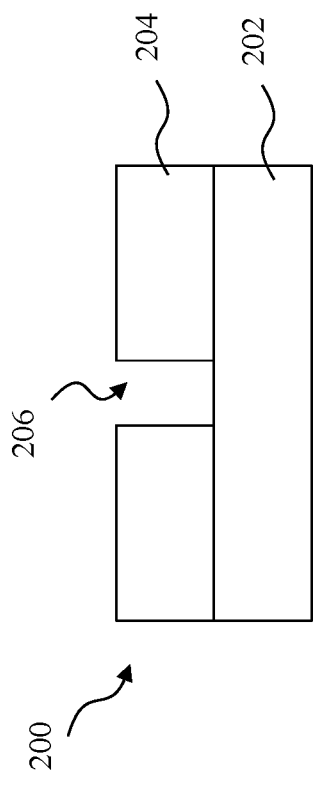
FIG. 2A
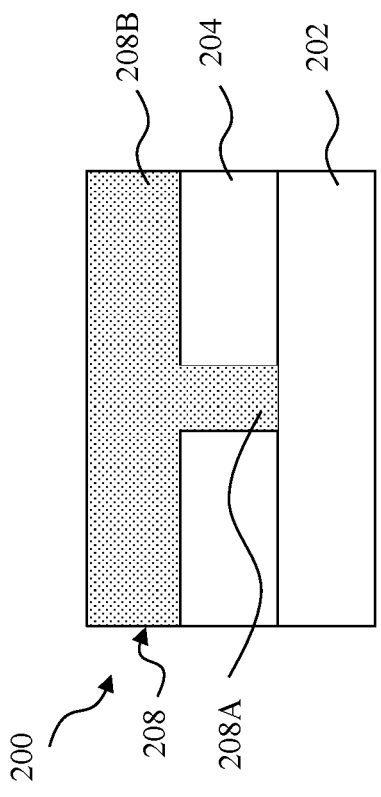
FIG. 2B
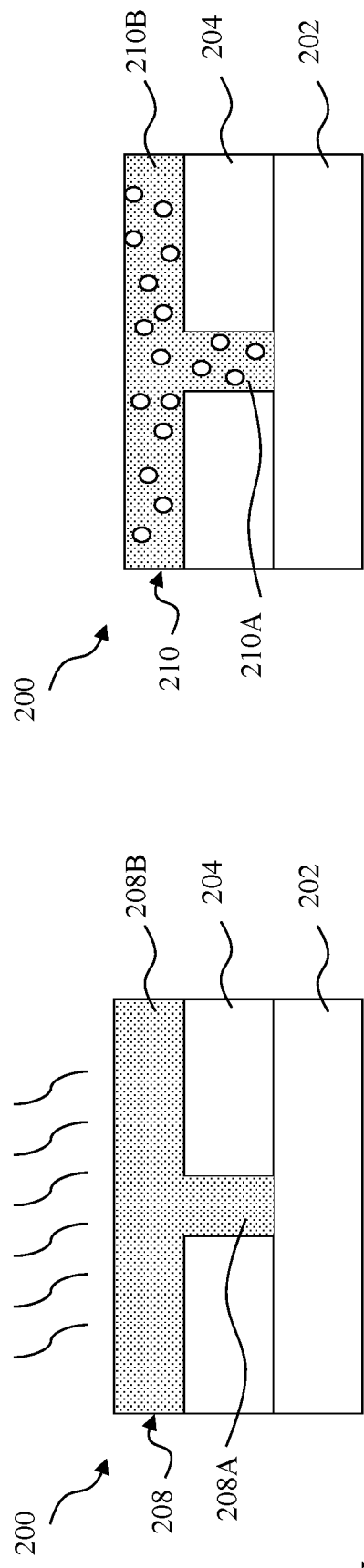
FIG. 2C
FIG. 2D

POROGEN BONDED GAP FILLING MATERIAL IN SEMICONDUCTOR MANUFACTURING

PRIORITY

This is a continuation application of and claims priority to U.S. patent application Ser. No. 17/120,672, filed Dec. 14, 2020, now U.S. Pat. No. 11,658,120, which is a divisional of U.S. patent application Ser. No. 15/942,947, filed Apr. 2, 2018, now U.S. Pat. No. 10,867,922, which is a divisional of U.S. patent application Ser. No. 14/752,097, filed Jun. 26, 2015, now U.S. Pat. No. 9,941,157, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, the continuing device miniaturization presents challenges to gap-filling (or trench-filling) dielectric materials. The new generations of devices often have complex topography that needs to be filled by a dielectric material in order to provide a flat top surface for further fabrication processes. The existing gap-filling dielectric materials generally contain multiple molecular components, of which some tend to stay on the top surface of the topography and some tend to stay on the bottom and/or sidewalls of the topography. This causes un-homogenous film property in the resultant dielectric fill layer and may result in delamination of the device and/or other issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, and 2D show cross-sectional schematic views of a semiconductor device manufactured by the method of FIG. 1A, in accordance with some embodiments.

DETAILED DESCRIPTION

Figure 1A:
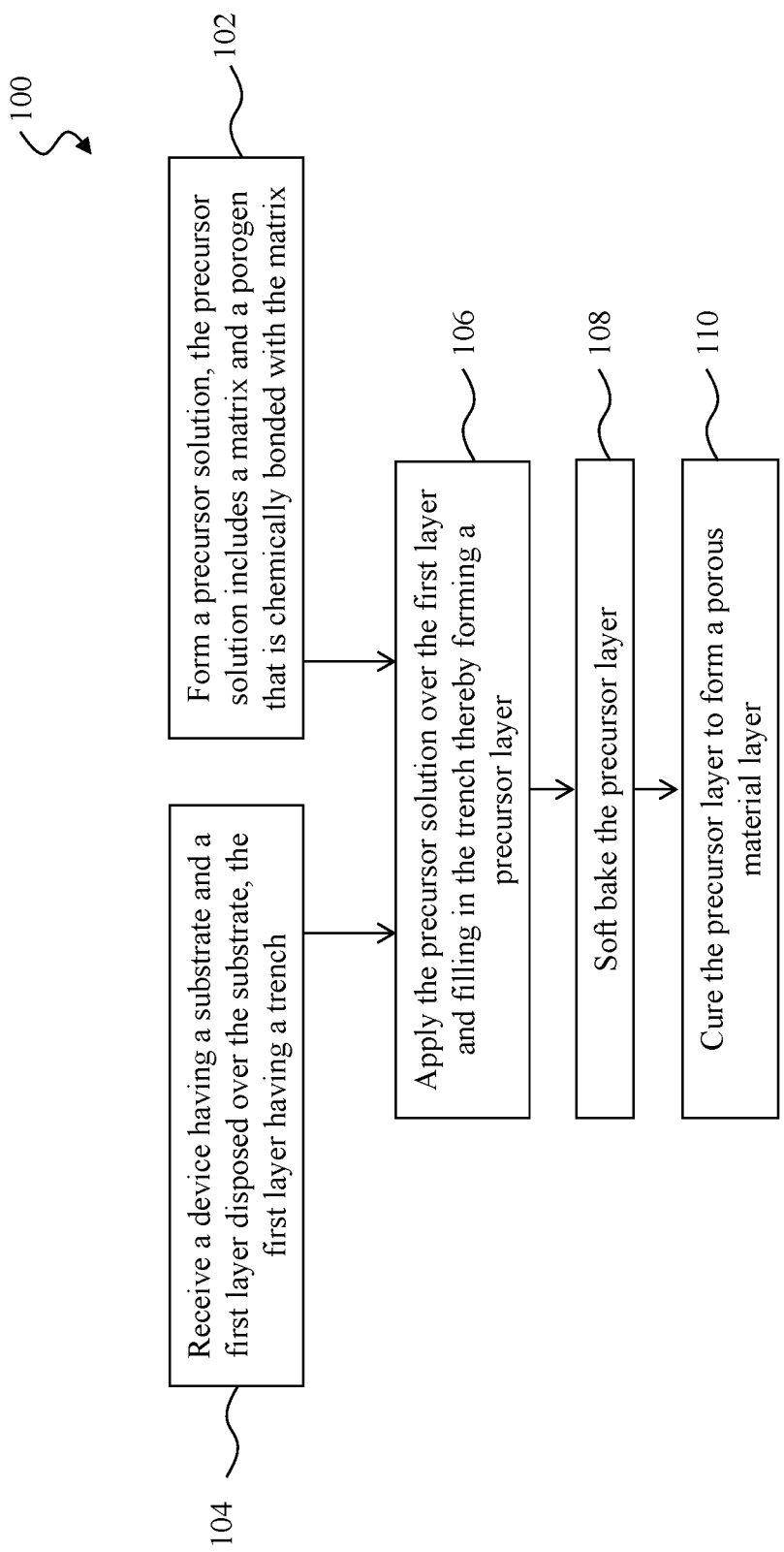
FIG. 1A is a flowchart of a method of fabricating a semiconductor device according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to a new gap-filling dielectric material and its applications in semiconductor manufacturing. More particularly, the new gap-filling dielectric material includes a main matrix and a porogen that is chemically bonded with the main matrix. The term "porogen" refers to any removable material added to a dielectric material as a pore forming material, that is a material such as polymeric particles dispersed in the dielectric material that is subsequently removed to yield pores in the dielectric material. The term "pore" refers to voids formed in the dielectric material. In various embodiments, the new gap-filling dielectric material can be used to fill trenches in one or more material layers disposed over a substrate and can result in a homogenous dielectric fill layer throughout the topography.

In a particular embodiment, the new gap-filling dielectric material is used to fill trenches in a metal layer disposed over a substrate to obtain an inter-metal dielectric fill layer. As a result of the chemical bonds between the porogen and the main matrix in the new dielectric material, the inter-metal dielectric fill layer provides substantially uniform dielectric property inside the metal trenches and over the metal layer. This enables a new direction in further reducing the critical dimension (CD) of multilayer metal interconnects, including metal wires. Metal wires are used to connect various devices (transistors, resistors, capacitors, etc.) to form an IC. As the device miniaturization continues, so does the need to reduce the CD of the metal wires.

A traditional method of fabricating metal wires uses a single or dual damascene process. In a damascene process, a dielectric layer is etched to form dielectric trenches, and the dielectric trenches are then overfilled with a metal. Chemical-mechanical planarization (CMP) is used to remove excessive metal, thereby forming metal wires in the dielectric trenches. To reduce the CD of the metal wires, the dielectric trenches need to become smaller. However, filling the smaller dielectric trenches with a metal becomes challenging and the resultant metal wires may have voids therein and sometimes lack uniform dimensions and properties.

In an alternative method, a metal layer is deposited over a substrate and is etched to have metal trenches therein. The remaining metal material becomes the metal wires over the substrate. A dielectric material is then formed over the metal layer and filled into the metal trenches. Since the metal wires are formed from one piece of metal, they have good uniformity. However, it is difficult to achieve uniform property in the inter-metal dielectric with existing gap-filling dielectric materials. Existing gap-filling dielectric materials are generally chemical compounds with many molecular components isolated from each other. As is often seen, some of the components tend to stay inside the metal trench and some tend to stay on the metal layer. This un-homogeneous inter-metal dielectric layer may cause non-uniform capacitance, affecting signal propagation, or even cause device delamination. The new gap-filling dielectric material as disclosed herein addresses such an issue, among other applications.

Figure 1B:
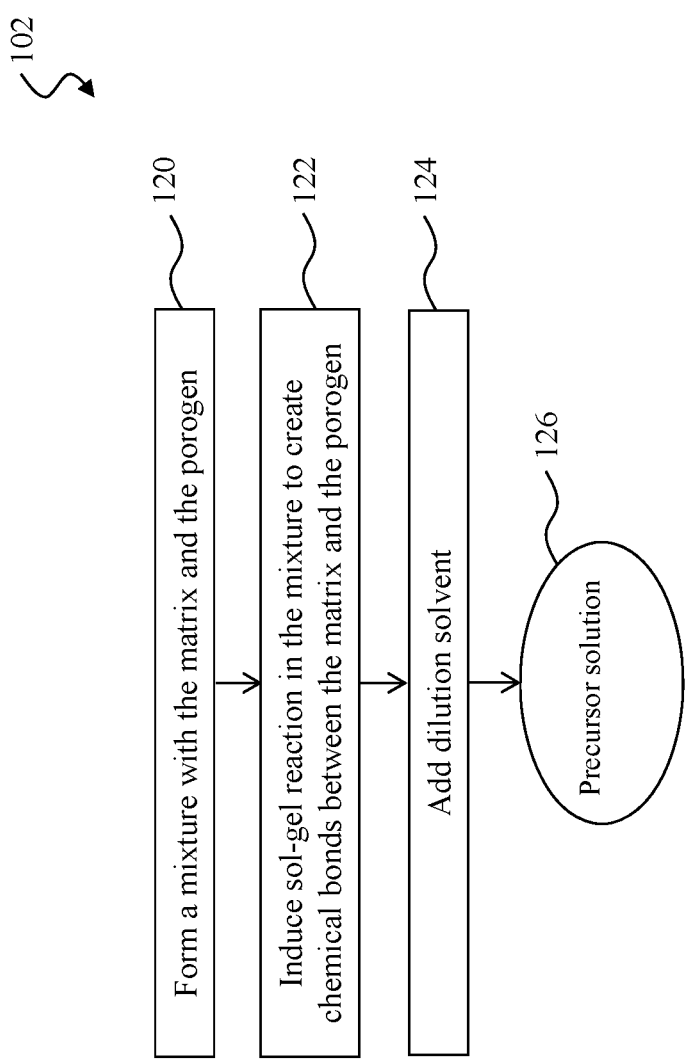
FIG. 1B is a flowchart of a method of preparing a gap-filling dielectric material, in accordance with some embodiments of the present disclosure.

FIGS. 1A and 1B show a method 100 of preparing the new gap-filling dielectric material and applying it in a semiconductor manufacturing process, according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 will be described below with references to FIGS. 1A and 1B, in conjunction with FIGS. 2A-2D which illustrate schematic cross-sectional views of a semiconductor device 200 in various fabrication stages. The semiconductor device 200 is provided for illustration purposes and does not necessarily limit the embodiments of the present disclosure to any number of devices, any number of regions, or any configuration of structures. Furthermore, the semiconductor device 200 may be an intermediate device fabricated during the processing of an IC, or a portion thereof, that may comprise static random access memory (SRAM) and/or other logic circuits, passive components such as resistors, capacitors, and inductors, and active components such as p-type field effect transistors (PFET), n-type FET (NFET), fin-like FET (FinFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring to FIG. 1A, at operation 102, the method 100 prepares the new gap-filling dielectric material as a precursor solution 126 (see FIG. 1B). The precursor solution 126 includes a main matrix (or simply, a matrix) and further includes a porogen. In various embodiments, the matrix may comprise a monomer such as tetramethoxysilane (TMOS), methyltrimethoxysilane (MTMS), methyltriethoxysilane (MTES), tetraethyl orthosilicate (TEOS), other suitable monomers, and/or a combination thereof. The monomer may be represented by the following formula:

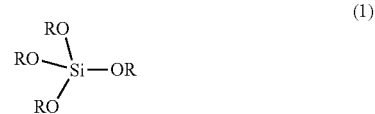

(1)

In the formula (1), R is an alkyl group such as methyl, ethyl, propyl, or butyl group. In some embodiments, the matrix may comprise two or more monomers. Further, the matrix may comprise hydrophilic monomers and/or hydrophobic monomers, of which varying ratios may be utilized to tune the property of the precursor solution 126. In various embodiments, the porogen may include a block co-polymer, such as a di-block co-polymer or a tri-block co-polymer. In further embodiments, the porogen includes an —OH functional group on a side chain of an -EO— or —PO— monomer. In one example, the porogen is a di-block co-polymer having the following formula:

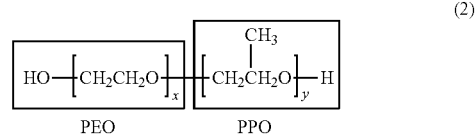

(2)

In another example, the porogen is a tri-block co-polymer having the following formula:

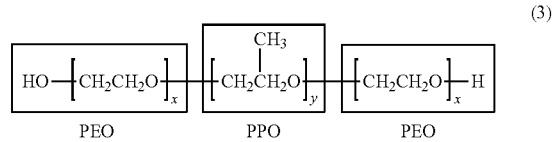

(3)

Continuing with the preparation of the precursor solution 126, the method 100 creates a chemical bond between the matrix and the porogen by mixing the matrix and the porogen in a solvent and inducing a chemical reaction therebetween. FIG. 1B shows an embodiment of operation 102, illustrating the formation of the precursor solution 126. Referring to FIG. 1B, the method 100 forms (operation 120) a mixture with the matrix and the porogen, with the addition of a solvent such as ethanol (EtOH), water ($H_2O$), and some hydrolysis catalyst such as hydrogen chloride (HCl). Subsequently, the method 100 induces (operation 122) a sol-gel reaction in the mixture to create a colloid. The sol-gel reaction may be performed in room temperature or may be performed in a temperature ranging from room temperature to 100 degrees Celsius or higher. In embodiments, the sol-gel reaction may last 30 minutes or up to 24 hours. In addition, the mixture may be stirred during the sol-gel reaction to speed up the process and to obtain a more uniform colloid. The sol-gel reaction creates Si—O—[CH$_2$CH$_2$O]$_x$ bonds between the matrix monomers and the porogen, and may additionally create bonds between the matrix monomers, as illustrated in the following reactions:

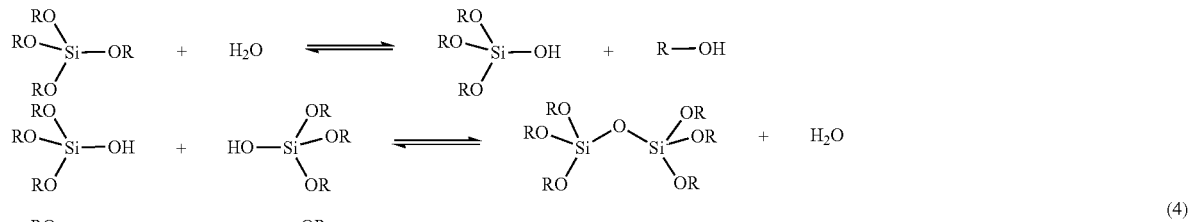

(4)

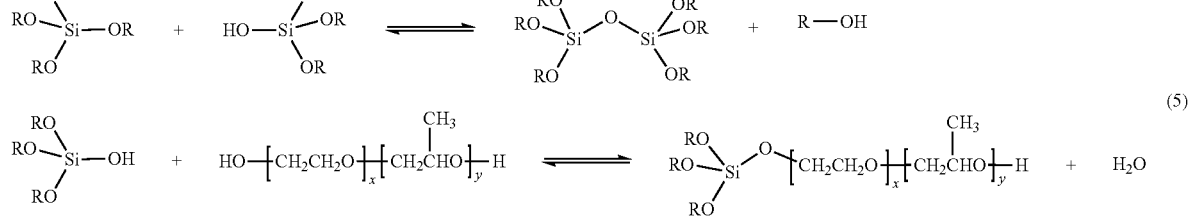

(5)

In the above, formula (4) illustrates some chemical reactions between matrix monomers (and water), while formula (5) illustrates a chemical reaction between a matrix monomer and a porogen. As shown in formula (5), the porogen is bonded to the matrix through a Si—O—[CH$_2$CH$_2$O]$_x$ bond. Still referring to FIG. 1B, the method 100 may add (operation 124) a dilution solvent to the colloid created by the sol-gel reaction. In various embodiments, the dilution solvent may include ethanol, isopropyl alcohol (IPA), propylene glycol monomethyl ether (PGME), propylene glycol methyl ether acetate (PGMEA), or a mixture thereof. The dilution solvent and the colloid are mixed and stirred to obtain the precursor solution 126. In the following discussion, the precursor solution 126 is also referred to as the gap-filling material 126.

Referring to FIG. 1A, at operation 104, the method 100 receives a device 200 that includes a substrate 202 and a first layer 204 formed thereon. As shown in FIG. 2A, the device 200 further includes a trench 206 in the first layer 204. In embodiments, the substrate 202 includes a silicon substrate (e.g., a wafer). Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor on insulator (SOI). The substrate 202 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs. The substrate 202 may further include passive devices such as resistors, capacitors, and inductors.

In the present embodiment, the first layer 204 includes a metallic material such as a metallic nitride, metallic or conductive oxide, an elemental metal, or a combination thereof. Therefore, the first layer 204 is also referred to as the metal layer 204. In various embodiments, the elemental metals may be selected from, but not limited to, the group consisting of copper (Cu), aluminum (Al), and titanium (Ti). In an embodiment, the metal layer 204 includes titanium nitride (TiN). The metal layer 204 may be formed over the substrate 202 using physical vapor deposition (PVD), chemical vapor deposition (CVD), sputtering, plating, or other suitable processes. The trench 206 is formed by etching the metal layer 204 using a dry etching, wet etching, reactive ion etching, or other suitable etching methods. Prior to the etching of the metal layer 204, a photolithography process may be performed to form a hard mask over the metal layer 204, and the hard mask defines the trench 206. An exemplary photolithography process includes coating a photoresist (or resist) layer, soft baking of the resist layer, mask aligning, exposure, post-exposure baking, developing the resist layer to form a resist pattern, rinsing, and drying (e.g., hard baking) the resist pattern. The resist pattern can be used as a hard mask for etching the metal layer 204. Alternatively, the resist pattern can be transferred to another layer underneath, which is used as the hard mask for etching the metal layer 204. Subsequently, the metal layer 204 is etched through the hard mask to remove portions of the metal layer 204, forming the trench 206. In an embodiment, the remaining portions of the metal layer 204 form a layer of metal interconnect for the device 200. In various embodiments, the trench 206 may have a depth (dimension in the "z" direction) ranging from 15 nanometers (nm) to 60 nm, such as about 45 nm, and a width (dimension in the "x" direction) ranging from 5 nm to 30 nm, such as about 20 nm. In some embodiments, the trench 206 has a wider opening at its top portion than at its bottom portion. In an embodiment, the device 200 further includes one or more layers between the substrate 202 and the metal layer 204, such as a nitrogen-free anti-reflective coating (NFARC) layer. In embodiments, the NFARC layer may include a material selected from the group consisting of silicon oxide, silicon oxygen carbide, and plasma enhanced chemical vapor deposited silicon oxide.

At operation 106, the method 100 (FIG. 1A) applies the precursor solution 126 prepared in operation 102 to the device 200, thereby forming a precursor layer 208. Referring to FIG. 2B, the precursor layer 208 includes a fill portion 208A in the trench 206 (FIG. 2A) and a bulk portion 208B over the metal layer 204. Because the porogens in the precursor solution 126 are bonded with the matrixes therein, the fill portion 208A and the bulk portion 208B are evenly distributed with porogens. In an embodiment, the precursor solution 126 is applied to the device 200 using a spin-on coating process. For example, the precursor solution 126 may be dispensed over the top surface of the device 200 while the device 200 (e.g., a wafer) is spun at a certain rotation rate, such as in a range from 500 rpm to 3000 rpm. Both the precursor solution dispense rate and the rotation rate can be controlled so as to achieve a substantially uniform thickness in the bulk portion 208B after the trench 206 (FIG. 2A) is completely filled. The spin-on coating process may be performed in room temperature, or in another suitable temperature. In embodiments, the precursor solution 126 can be applied with other methods, such as dip coating, spray coating, and roll coating.

At operation 108, the method 100 (FIG. 1A) performs a soft baking process to the device 200. Referring to FIG. 2C, illustrated therein is the precursor layer 208 undergoing the soft baking process. The soft baking process drives solvents out of the precursor layer 208 and may promote chemical reactions (such as cross-linking processes) inside the precursor layer 208. As a result of the soft baking process, the precursor layer 208 further solidifies and often shrinks in its thickness. In various embodiments, the soft baking process may be performed in a temperature ranging from about 100 degrees Celsius to about 300 degrees Celsius for a duration ranging from about 30 seconds to about 180 seconds.

At operation 110, the method 100 (FIG. 1A) cures the precursor layer 208, thereby forming a porous material layer 210 as shown in FIG. 2D. In various embodiments, the operation 110 may utilize an ultraviolet (UV) curing process, a thermal curing process, or other suitable curing processes. For example, the precursor layer 208 may be cured using a high intensity UV light at about 400 degrees Celsius for about 10 minutes. As another example, the precursor layer 208 may be thermally cured at about 400 degrees Celsius with an $N_2$ gas flow for about 1 hour to about 2 hours. Referring to FIG. 2D, the curing process drives the porogens out of the precursor layer 208, leaving pores (small voids) in the porous material layer 210. In some instances, the porogens may be completely driven out of the precursor layer 208. In addition, the curing process may cause further chemical reactions in the precursor layer 208, such as polymer cross-linking. As a result, the porous material layer 210 further solidifies and shrinks in its thickness.

As shown in FIG. 2D, the porous material layer 210 includes a fill portion 210A inside the trench 206 (FIG. 2A) and a bulk portion 210B over the metal layer 204. In various embodiments, the fill portion 210A is about 15 nm to about 60 nm tall (along the "z" direction) and the bulk portion 210B is about 1 nm to about 200 nm thick (along the "z" direction). Because the porogens are evenly distributed in the precursor layer 208, the resultant pores are also evenly distributed in the porous material layer 210. In other words, the fill portion 210A and the bulk portion 210B contain substantially the same level of porosity. This is advantageous over gap-filling materials which do not have porogens bonded with matrixes. With those gap-filling materials, porogens tend to stay in fill portions (inside trenches) and matrixes tend to stay in a bulk portion (over the top surface of an underlying layer). The resultant porous material would have higher porosity in the fill portions than in the bulk portion, causing a phase separation issue. A comparison of film property between a film formed with the gap-filling material 126 and another film formed with another gap-filling material can be seen in FIGS. 3A and 3B.

Figure 3A:
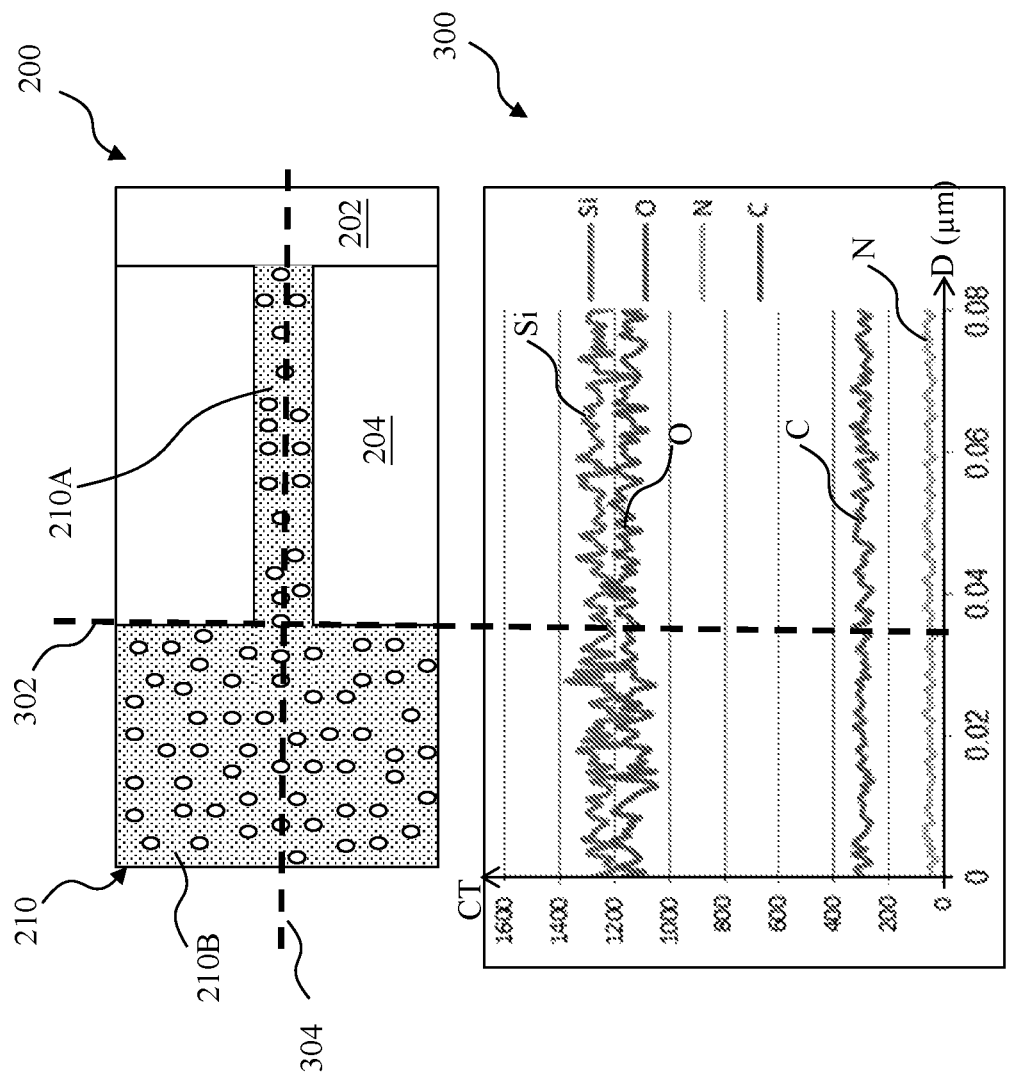
FIG. 3A shows chemical contents of a gap-filling dielectric material, in accordance with some embodiments of the present disclosure.

FIG. 3A shows a graph 300 of atom counts of each of the chemical elements Si, O, N, and C in the porous material layer 210 formed with the gap-filling material 126, in accordance with some embodiments. The atom counts of the chemical elements are obtained using x-ray diffraction (XRD) analysis upon the porous material layer 210 in an embodiment of the device 200. The horizontal axis "D" represents the depth (or thickness) of the porous material layer 210, with the top surface of the bulk portion 210B at the origin (depth D=0 μm). The dashed line 302 indicates an imaginary boundary surface between the bulk portion 210B and the fill portion 210A. The vertical axis "CT" represents the counts of atoms for each of the chemical elements of interest, taken along the dashed line 304 which traverses the bulk portion 210B and the fill portion 210A. As shown in the graph 300, each of the chemical elements Si, O, N, and C is near uniformly distributed in the porous material layer 210. In this particular embodiment, the average percentage content of Si in the bulk portion 210B is about the same as the average percentage content of Si in the fill portion 210A, and the difference between the two is less than 10%. This holds true for each of the elements O, C, and N for this particular embodiment. This is a result of the near uniformly distributed pores in the porous material layer 210, which is in turn a result of the unique property of the precursor solution 126 where porogens are chemically bonded with matrixes.

Figure 3B:
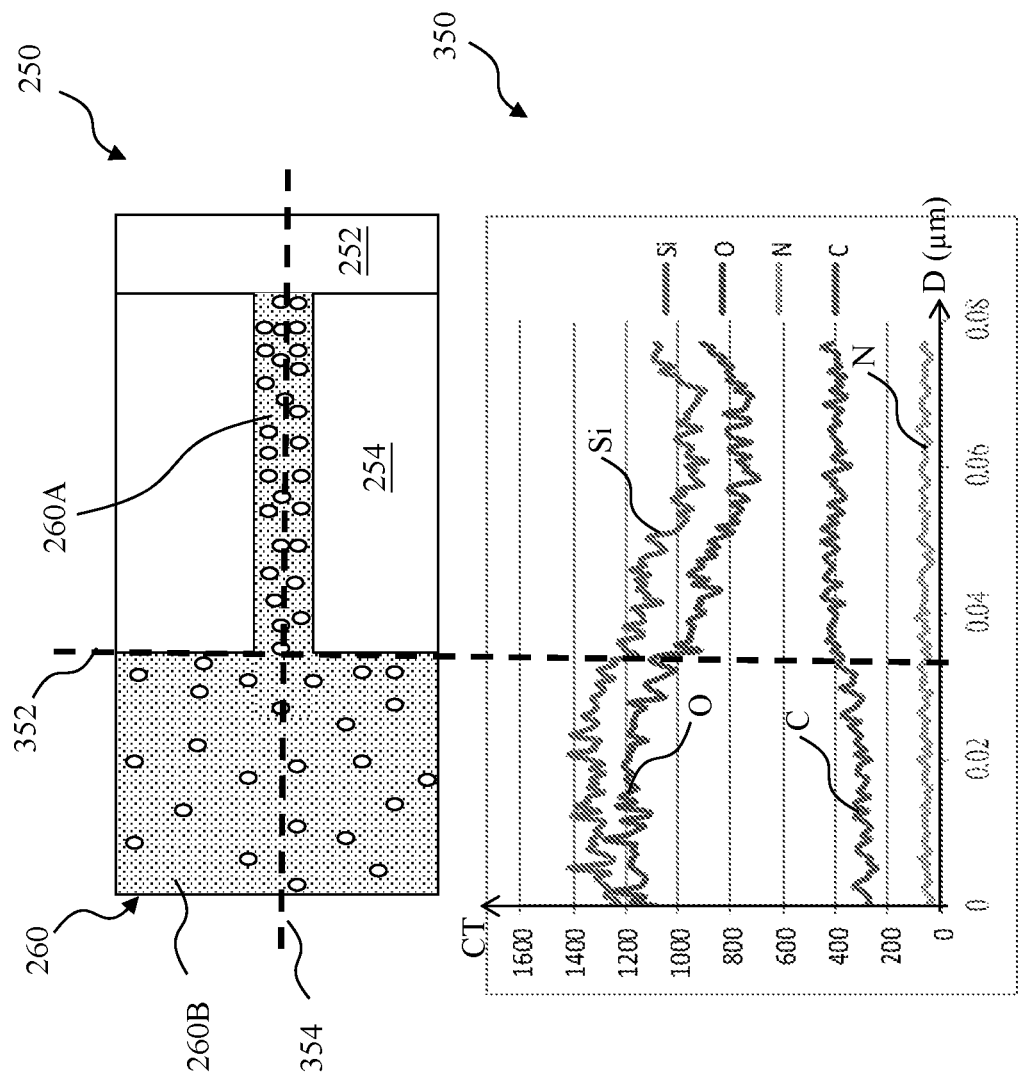
FIG. 3B shows chemical contents of another gap-filling dielectric material.

FIG. 3B shows a graph 350 of atom counts of each of the chemical elements Si, O, N, and C in a porous material layer 260 formed with another gap-filling material, which, unlike the gap-filling material 126, does not have porogens chemically bonded with matrixes. The porous material layer 260 is formed over a device 250 that includes a substrate 252 and a metal layer 254. The substrate 252 and the metal layer 254 are substantially the same as the substrate 202 and the metal layer 204 respectively. The porous material layer 260 also includes a fill portion 260A in a metal trench and a bulk portion 260B over a top surface of the metal layer 254. Because the porogens are not chemically bonded with the matrixes in this gap-filling material, the fill portion 260A has higher porosity than the bulk portion 260B. The horizontal axis "D" represents the depth of the porous material layer 260, with the top surface of the bulk portion 260B at the origin (depth D=0 μm). The dashed line 352 indicates an imaginary boundary surface between the bulk portion 260B and the fill portion 260A. The vertical axis "CT" represents the counts of atoms for each of the chemical elements of interest, taken along the dashed line 354 which traverses the bulk portion 260B and the fill portion 260A. As shown in the graph 350, each of the chemical elements Si, O, and C is unevenly distributed in the porous material layer 260. Particularly, the percentage contents of Si and O each exhibits a decreasing trend from the bulk portion 260B to the fill portion 260A, while the percentage contents of C exhibits an increasing trend from the bulk portion 260B to the fill portion 260A. For Si, its percentage content decreases about 27% from the bulk portion 260B (with an average count about 1300) to the bottom part of the fill portion 260A (with an average count about 950). For O, its percentage content decreases about 29% from the bulk portion 260B (with an average count about 1200) to the bottom part of the fill portion 260A (with an average count about 850). Such un-homogeneous film property may result in delamination of the bulk portion 260B from the fill portion 260A. In contrast, the porous material layer 210 (FIG. 3A) has homogeneous or near-homogeneous film property, which is advantageous for the device 200.

Figure 4:
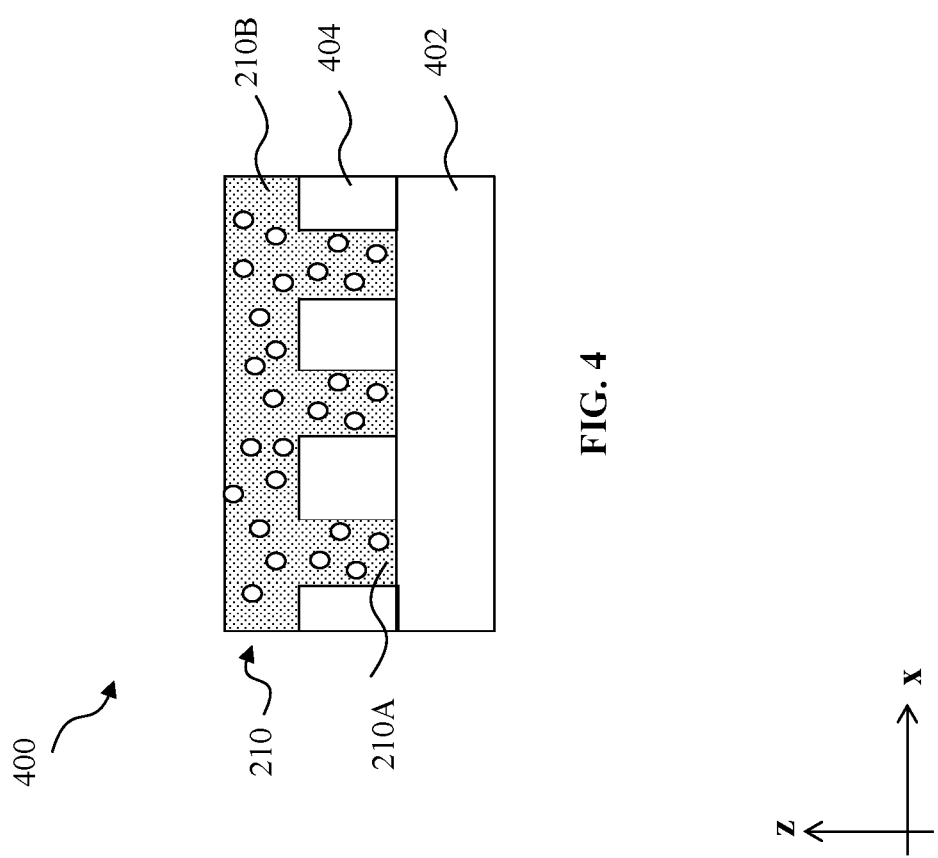
FIG. 4 shows a cross-sectional schematic view of another semiconductor device manufactured by the method of FIG. 1A, in accordance with some embodiments.

The gap-filling material 126 according to the present disclosure is not limited to fill gaps in a metal layer. In various embodiments, the gap-filling material 126 may be used to fill dielectric trenches, to form a low-k dielectric material layer, or to be used in a photoresist for photolithography. FIG. 4 illustrates the application of the gap-filling material 126 in one of these embodiments.

Referring to FIG. 4, shown therein is a device 400 that includes a substrate 402, various features 404, and a dielectric layer 210 formed over the substrate 402 and filling the trenches between the features 404. In embodiments, the substrate 402 may be substantially the same as the substrate 202 (FIG. 2A). In embodiments, the features 404 may be fins in a FinFET, or may be gate stacks in a planar transistor or a three dimensional (3D) transistor, or may be other circuit features. In an embodiment, the dielectric layer 210 is formed by spin coating the gap-filling material 126 over the substrate 402 and the features 404, and then curing the gap-filling material 126 with a method discussed above. The gap-filling material 126 may be softly baked in some embodiments before the curing process. After the porogens are substantially driven out of the gap-filling material 126, a low-k dielectric layer 210 is formed, which has near homogenous film property in its fill portions 210A and its bulk portion 210B. In embodiments, further circuit features, such as source, drain, and gate contacts, may be formed in the low-k dielectric layer 210.

Although not intended to be limiting, one or more embodiments of the present disclosure provide many benefits to an integrated circuit and the formation thereof. In an embodiment, the gap-filling dielectric material according to the present disclosure can be used to fill metal trenches to obtain a homogeneous inter-metal dielectric layer. This provides a new approach to forming metal interconnect with reduced critical dimension for new generations of ICs. In embodiments, both the process of preparing the gap-filling dielectric material and the process of applying it to a precursor device are simple and can be easily integrated into existing manufacturing flow. Furthermore, the gap-filling material itself is cost effective.

In one exemplary aspect, the present disclosure is directed to a method for semiconductor manufacturing. The method includes receiving a device that includes a substrate and a first layer disposed over the substrate, wherein the first layer includes a trench. The method further includes applying a first material over the first layer and filling in the trench, wherein the first material contains a matrix and a porogen that is chemically bonded with the matrix. The method further includes curing the first material.

In another exemplary aspect, the present disclosure is directed to a method. The method includes forming a precursor solution comprising a matrix and a porogen that is chemically bonded with the matrix. The method further includes applying the precursor solution to a device that includes a first layer disposed over a substrate, wherein the first layer includes a trench, and wherein the precursor solution forms a precursor layer over the first layer and in the trench. The method further includes curing the precursor layer to form a porous material layer having a first portion in the trench and a second portion over the first layer.

In yet another exemplary aspect, the present disclosure is directed to a device that includes a substrate, a metallic material layer over the substrate and having a first trench, and a porous material layer having a first portion and a second portion. The first portion is disposed in the trench, the second portion is disposed over the metallic material layer, and the first and second portions contain substantially the same percentage of each of Si, O, and C.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
     a substrate, and
     a first layer over the substrate, the first layer including a plurality of fin features and a trench between two adjacent fin features;
   applying a first material over the workpiece, wherein the first material contains a matrix and a porogen that is chemically bonded with the matrix before the first material is applied, wherein the porogen includes a

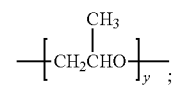

and
   curing the first material.

2. The method of claim 1, wherein, after the curing of the first material, a first portion of the first material that is disposed in the trench and a second portion of the first material that is disposed on a top surface of the first layer contain substantially a same level of porosity.

3. The method of claim 2, wherein, after the curing of the first material, the first and the second portions of the first material contain substantially same percentage of Si element, substantially same percentage of O element, substantially same percentage of C element, and substantially same percentage of N element.

4. The method of claim 1, wherein the porogen includes a di-block copolymer or a tri-block copolymer.

5. The method of claim 1, wherein the porogen is chemically bonded with the matrix through a Si—O—[CH$_2$CH$_2$O]$_x$ bond.

6. The method of claim 1, wherein the applying of the first material includes a spin-on coating process.

7. The method of claim 1, further comprising:
   before the applying of the first material, preparing the first material, which includes inducing a sol-gel reaction between the matrix and the porogen.

8. The method of claim 1, wherein the curing of the first material includes a thermal curing or an ultraviolet (UV) curing.

9. The method of claim 1, further comprising, before the curing of the first material:
   soft baking the first material.

10. A method, comprising:
forming a precursor solution comprising a matrix and a porogen that includes a

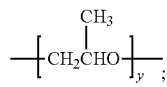 ;

chemically bonded with the matrix through a Si—O—[CH$_2$CH$_2$O]$_x$ bond;
applying the precursor solution to a workpiece that includes a first fin feature and a second fin feature disposed over a substrate and separated by a trench, wherein the applying of the precursor solution forms a precursor layer over the first and second fin features and in the trench; and
curing the precursor layer to form a porous material layer having a first portion in the trench and a second portion over the first and second fin features.

11. The method of claim 10, wherein the forming of the precursor solution includes:
forming a mixture having the matrix and the porogen; and
inducing sol-gel reaction between the matrix and the porogen.

12. The method of claim 11, wherein the mixture further includes ethanol (EtOH), water (H$_2$O), and hydrogen chloride (HCl).

13. The method of claim 11, wherein the forming of the precursor solution further includes, after the inducing of the sol-gel reaction:
adding dilution solvent to the mixture.

14. The method of claim 10, wherein, the first portion of the porous material layer and the second portion of the porous material layer contain substantially a same level of porosity.

15. The method of claim 14, wherein the first and second portions of the porous material layer contain substantially same percentage of Si element, substantially same percentage of O element, substantially same percentage of C element, and substantially same percentage of N element.

16. The method of claim 10, further comprising, before the curing of the precursor layer:
soft baking the precursor layer.

17. The method of claim 10, wherein the matrix includes one or more monomers of tetramethoxysilane (TMOS), methyltrimethoxysilane (MTMS), methyltriethoxysilane (MTES), or tetraethyl orthosilicate (TEOS).

18. A method, comprising:
receiving a workpiece comprising a first semiconductor fin and a second semiconductor fin over a substrate and separated by a trench;
applying a first material over the workpiece, the first material having a first portion disposed over the first and second semiconductor fins and a second portion in the trench, wherein the first material contains a matrix and a porogen that is chemically bonded with the matrix before the first material is applied, wherein the porogen includes a

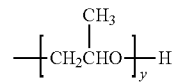

component; and
curing the first material, wherein the matrix includes one or more monomers of tetramethoxysilane (TMOS), methyltrimethoxysilane (MTMS), methyltriethoxysilane (MTES), or tetraethyl orthosilicate (TEOS).

19. The method of claim 18, further comprising:
before the applying of the first material, forming a mixture having the matrix and the porogen; and
inducing sol-gel reaction between the matrix and the porogen.

20. The method of claim 18, wherein, after the curing of the first material, the first portion of the first material includes a first level of porosity, the second portion of the first material includes a second level of porosity, and the first level of porosity and the second level of porosity differ by less than 10%.

* * * * *